(12) United States Patent
Yajima

(10) Patent No.: US 9,459,660 B2
(45) Date of Patent: Oct. 4, 2016

(54) DISPLAY DEVICE AND ELECTRONIC APPARATUS

(71) Applicant: SEIKO EPSON CORPORATION, Tokyo (JP)

(72) Inventor: Hideaki Yajima, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 225 days.

(21) Appl. No.: 14/097,934

(22) Filed: Dec. 5, 2013

(65) Prior Publication Data

US 2014/0192495 A1 Jul. 10, 2014

(30) Foreign Application Priority Data

Jan. 10, 2013 (JP) .................................. 2013-002367

(51) Int. Cl.
*G06F 1/16* (2006.01)
*H05K 5/00* (2006.01)
*H01L 51/52* (2006.01)

(52) U.S. Cl.
CPC ........... *G06F 1/1637* (2013.01); *H05K 5/0017* (2013.01); *H01L 51/5237* (2013.01)

(58) Field of Classification Search
CPC .......................... G06F 1/1637; H05K 5/0017
USPC .................. 361/679.21; 313/582; 349/58–60
See application file for complete search history.

(56) References Cited

U.S. PATENT DOCUMENTS

| | | | | |
|---|---|---|---|---|
| 5,150,231 A * | 9/1992 | Iwamoto | ........... | G02F 1/133308 349/122 |
| 5,545,280 A * | 8/1996 | Wenz | ................. | G02F 1/13394 156/234 |
| 5,666,261 A * | 9/1997 | Aguilera | ................... | B32B 3/12 165/185 |
| 5,703,665 A * | 12/1997 | Muramatsu | ....... | G02F 1/133308 349/58 |
| 5,880,795 A * | 3/1999 | Nagata | .............. | G02F 1/133308 349/150 |
| 6,166,797 A * | 12/2000 | Bruzzone | ............ | G02F 1/13394 349/155 |
| 6,555,213 B1 * | 4/2003 | Koneripalli | ............. | B32B 27/32 428/304.4 |
| 6,744,186 B2 * | 6/2004 | Oishi | ................. | H05K 7/20963 313/46 |
| 7,095,943 B2 * | 8/2006 | Emmons | ................ | G02B 5/045 362/602 |
| 7,218,831 B2 * | 5/2007 | Pokorny | ................ | G02B 5/045 362/602 |
| 7,323,808 B2 * | 1/2008 | Kim | .................... | H05K 7/20963 313/44 |
| 7,342,792 B2 * | 3/2008 | Kim | ........................ | H05K 5/02 165/104.33 |
| 8,111,368 B2 * | 2/2012 | Liu | ..................... | G02F 1/13394 349/153 |
| 8,325,471 B2 * | 12/2012 | Yokota | ..................... | H05K 5/02 312/223.1 |
| 9,129,659 B2 * | 9/2015 | Montevirgen | ......... | G11B 33/08 |

(Continued)

FOREIGN PATENT DOCUMENTS

JP A-2010-72380 4/2010
JP A-2010-152266 7/2010

(Continued)

*Primary Examiner* — Adrian S Wilson
(74) *Attorney, Agent, or Firm* — Oliff PLC

(57) ABSTRACT

A display device includes a display panel in which a display surface is formed on a substrate; a case having a groove portion with which the display panel is fitted; an adhesive adhering a bottom surface of the groove portion and a rear surface of the display surface, and a protrusion formed on the bottom surface and having a predetermined height.

18 Claims, 8 Drawing Sheets

(56) References Cited

U.S. PATENT DOCUMENTS

| | | | | |
|---|---|---|---|---|
| 2002/0158853 | A1* | 10/2002 | Sugawara | G02B 6/10 345/176 |
| 2002/0180710 | A1* | 12/2002 | Roberts | G06F 3/0414 345/173 |
| 2005/0047100 | A1* | 3/2005 | Kim | H05K 7/142 361/758 |
| 2005/0184970 | A1* | 8/2005 | Wegert | H03K 17/96 345/173 |
| 2006/0098415 | A1* | 5/2006 | Kim | H05K 5/02 361/740 |
| 2007/0054093 | A1* | 3/2007 | Sakurai | B32B 7/06 428/156 |
| 2007/0182877 | A1* | 8/2007 | Tanokuchi | H05K 5/02 349/58 |
| 2009/0251855 | A1* | 10/2009 | Tanokuchi | H05K 5/02 361/679.21 |
| 2009/0283211 | A1* | 11/2009 | Matsuhira | B29C 65/1435 156/275.7 |
| 2010/0073620 | A1 | 3/2010 | Yamaguchi et al. | |
| 2010/0165461 | A1 | 7/2010 | Ninomiya | |
| 2010/0265195 | A1* | 10/2010 | Watanabe | C09J 7/00 345/173 |
| 2010/0271783 | A1 | 10/2010 | Miyashita | |
| 2013/0063885 | A1* | 3/2013 | Shedletsky | F16F 7/1028 361/679.21 |

FOREIGN PATENT DOCUMENTS

| | | |
|---|---|---|
| JP | A-2010-256654 | 11/2010 |
| JP | A-2011-165444 | 8/2011 |
| JP | A-2011-165497 | 8/2011 |
| JP | A-2011-204645 | 10/2011 |
| JP | A-2011-216353 | 10/2011 |

* cited by examiner

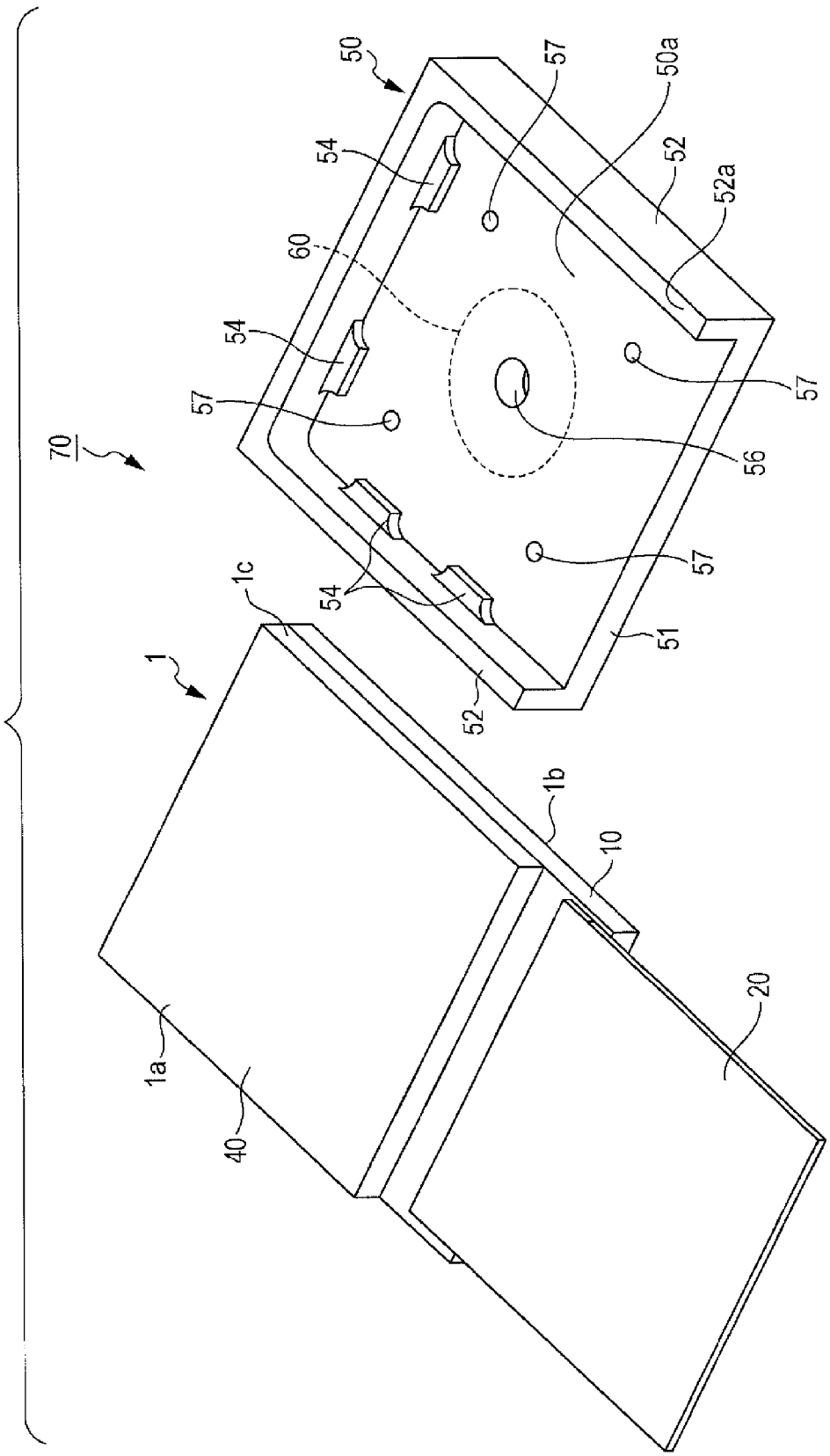

DISPLAY DEVICE AND ELECTRONIC APPARATUS

BACKGROUND

1. Technical Field

The present invention relates to a display device maintaining parallelism of one adherend to another by making the thickness of an adhesive uniform when a display panel is adhered to a case by the adhesive in an electronic apparatus including the display panel, such as a smartphone, a head mounted display (HMD), digital camera or an electrical viewfinder (EVF) mounted to a digital camera, and an electronic apparatus including the display device.

2. Related Art

In recent years, development has progressed of self-luminous display devices using an organic electroluminescence (EL) element in which the element itself emits light when a voltage is applied, and such display devices are used in various electronic apparatuses, such as smartphones, head mounted displays, digital cameras, and electrical viewfinders mounted to digital cameras.

In a self-luminous display device, a heat dissipating case with a high thermal conductivity and a substrate of the display device are bonded together with the intention of efficiently radiating heat occurring from light emission to the outside. Specifically, bonding is performed by overlapping the panel face of the substrate and spreading the adhesive through weighting after coating the plane of the case with a moisture-curable adhesive.

Here, as the moisture-curable adhesive, when a low viscosity adhesive is used, because the thickness of the adhesive itself has a thinness of approximately several μm, the adhesion strength lowers and peeling occurs due to the thermal contraction difference between each adherend. Meanwhile, when a high viscosity adhesive is used in order to increase the thickness, when weighting, variations occur in the method of adding pressure with respect to each position on the surface, and differences occur in the method of spreading the adhesive. As a result, the thickness of the adhesive at each position in the surface does not become uniform, and there is a problem that the parallelism of the display panel with respect to the bottom surface of the case is lowered.

In particular, an electrical viewfinder mounted to a digital camera causes image information obtained from an imaging element to be displayed on a display panel in the camera, and a user observes a subject from an image displayed on the electrical viewfinder by peering at the electrical viewfinder with one eye. In this case, because the subject may be directly observed with the other eye, when the subject is observed with the left and right eyes, there is a problem with a shift in the subject occurring in a case of using a display device with a lowered parallelism in the electrical viewfinder.

JP-A-2010-256654 attempts to solve such a problem. The technology disclosed in JP-A-2010-256654 allows adhesive to be extended thinly and uniformly by the coated adhesive collecting in the appropriate groove portion during adhesion through providing a groove filled with adhesive at a part being adhered to the case substrate.

However, in a case in which a groove is provided in the case as in the technology disclosed in JP-A-2010-256654, there is demand for a proper amount of adhesive coating in the groove. That is, in a case in which the amount of adhesive coating is low, the adhesion locations between the case and the substrate are reduced, and the adhesion strength is lowered. Meanwhile, in a case in which the amount of adhesive coating is high, because the adhesive overflows outside of the groove, the parallelism is impaired by the occurrence of differences in the thickness of the adhesive in the surface, depending on the method of applying pressure with respect to each position on the surface.

Here, when bonding of the substrate and the case is performed, it is possible to lower the differences in the thicknesses thereof by lengthening the weighting time, or increasing the weighting pressure; however, there are problems in which the thickness of the adhesive becomes thinner due to the increase in pressure, or the time for the bonding process increases due to the increase in the weighting time.

SUMMARY

An advantage of some aspects of the invention is to provide a display device capable of securing parallelism with high precision between a display panel and a case in an electronic apparatus including the display panel, such as a smartphone, a head mounted display, a digital camera or an electrical viewfinder mounted to the digital camera, and an electronic apparatus including the display device.

According to an aspect of the invention, there is provided a display device including a display panel (for example, a display panel 1 in FIG. 1A) in which a display surface (for example, a display surface 1a in FIG. 1A) is formed on a substrate (for example, a substrate 10 in FIG. 1A); a case (for example, a case 50 in FIG. 1A) having a groove portion (for example, a groove portion 50a in FIG. 1A) with which the display panel is fitted; an adhesive (for example, an adhesive 60 in FIG. 1A) adhering a bottom surface (for example, a bottom surface 51a in FIG. 1A) of the groove portion and a rear surface (for example, a rear surface 1b in FIG. 1A) of the display surface, and protrusions (for example, protrusions 57 in FIG. 1A) formed on the bottom surface and having a predetermined height.

The "case" in the aspect of the invention signifies a component or location of the apparatus by which the position at which the display panel is arranged is determined. The "groove portion in which the display panel is fitted" in this case signifies a part which positions the display panel and may be a convex portion performing positioning by surrounding all or a portion of the periphery of the display panel, in addition to a concave portion having the same shape as the planar shape of the display panel or an area greater than this. Furthermore, according to the aspect of the invention, a pedestal shape having an area to the degree to which the upper surface is flat, in addition to a tip having a spherical surface shape, a pointed shape or the like, is also included in the term "protrusion", if projected from the bottom surface of the groove portion.

According to the aspect of the invention, since protrusions are provided on the bottom surface of the case in which the rear surface of the display panel is adhered, if the display panel is fitted to the case and pressure is added, the protrusions bump into the rear surface of the display panel and the distance between the rear surface of the display panel and the bottom surface of the case becomes fixed. Next, an adhesive is accommodated in the space in which the distance between the rear surface of the display panel and the bottom surface of the case is fixed, and the display panel and the case are adhered by the adhesive. In so doing, when adhering each adhered member with adhesive, it is possible to bond the adhered members to each other precisely securing parallelism of the display panel and the case without adjusting the amount of weighting added to the substrate or the weighting time.

In addition, according to the aspect of the invention, a space in which the adhesive is accommodated is formed between the display panel and the case by the protrusions, and because the height of the space becomes the thickness of the adhesive, it is possible to set an appropriate adhesion strength by setting the height of the protrusions as the necessary thickness of adhesive.

Then, when using the display device in which such parallelism is precisely secured, for example, in an electrical viewfinder, even in a case in which a subject is directly observed with one eye and the subject is viewed through the electrical viewfinder with the other eye, it is possible to prevent the occurrence of shifting in the subject.

It is preferable that two or more protrusions be provided. In this case, since two or more protrusions are provided at positions of the groove portion of the case, it is possible to fix the distance of between the bottom surface of the display panel and the bottom surface of the case on the surface by each protrusion bumping the rear surface of the display panel with good balance. As a result, it is possible to precisely secure the parallelism between each adherend.

It is preferable that the protrusions be arranged to be point symmetric with respect to the center point (for example, a center point CP in FIG. 6A) of the bottom surface of the groove portion or linearly symmetric with respect to a center line (for example, a center line CL in FIG. 6B) passing through the center point. In this case, since the protrusions are arranged to be point symmetric with respect to the center point of the bottom surface of the groove portion or linearly symmetric with respect to a center line passing through the center point, the respective protrusions arranged with the center point or center line interposed bump into the rear surface of the display panel with good balance and it is possible to fix the distance between the bottom surface of the display panel and the bottom surface of the case on the surface. As a result, it is possible to precisely secure the parallelism between each adherend.

It is preferable that a moisture permeable hole (for example, a moisture permeable hole 56 in FIG. 1A) penetrating the bottom surface in the center of the bottom surface of the groove portion be further included, and that two or more protrusions be arranged at the periphery of the moisture permeable hole. In this case, since there is a moisture permeable hole penetrating the bottom surface of the groove portion in the case, parts of a moisture-curable adhesive arranged between the case and the substrate overlapping the moisture permeable hole are exposed. Therefore, since the moisture-curable adhesive contacts the air not only at the tip, but also at parts overlapping the moisture permeable holes, curing progresses more easily compared to a case in which the moisture permeable holes are not provided.

In addition, in this case, since a moisture permeable hole is positioned in the center of the bottom surface of the groove portion and two or more protrusions are arranged at the periphery of the moisture permeable hole positioned at the center of the bottom surface of the groove portion, it is possible to fix the distance between the bottom surface of the display panel and the bottom surface of the case on the surface by the protrusions appropriately bumping into the rear surface of the display panel with the center of the bottom surface as a center. As a result, it is possible to precisely secure the parallelism between each adherend.

It is preferable that the protrusions be formed with a shape becoming thinner toward the apex. In this case, the apex contacting the display panel is in point contact with respect to the rear surface. Therefore, when the display panel is pressed, the adhesive coated on the upper portion of the apex becomes pushed outward to the periphery, and when the adhered members are bonded, adhesive is not present on the apex of the protrusion. In so doing, it is possible for the protrusions to reliably bump into the rear surface of the display panel, and is possible to precisely secure the parallelism of each adherend.

In addition, according to another aspect of the invention, there is provided an electronic apparatus (for example, a digital camera 100 in FIG. 7) including the display device disclosed above. According to the aspect of the invention, it is possible to provide a high quality and high capacity electronic apparatus, since a display device with high parallelism is included. That is, for example, in a case where an electrical viewfinder is used as an electrical device, because image light emitted from the display panel of the electrical viewfinder is guided perpendicularly with respect to the eye, the subject may be viewed in the same position as a case in which the subject is directly observed. Therefore, even in a case in which the subject is observed through the electrical viewfinder with one eye and the subject is directly observed with the other eye, it is possible to prevent the occurrence of shifting in the subject.

BRIEF DESCRIPTION OF THE DRAWINGS

The invention will be described with reference to the accompanying drawings, wherein like numbers reference like elements.

FIG. 5 is an exploded perspective view of a display device according to an embodiment.

DESCRIPTION OF EXEMPLARY EMBODIMENTS

Below, preferred embodiments of the invention will be described in detail with reference to the attached diagrams, or the like. However, in each drawing, the dimensions and scale of each portion are made different from those of the actual apparatus as appropriate. In addition, since the embodiments described above are preferred examples of the invention, even though various preferred technical limits are applied, the scope of the invention is not limited to the these forms unless a limitation on the invention is specifically disclosed in the following description.

Configuration of Display Device

Figure 1A:
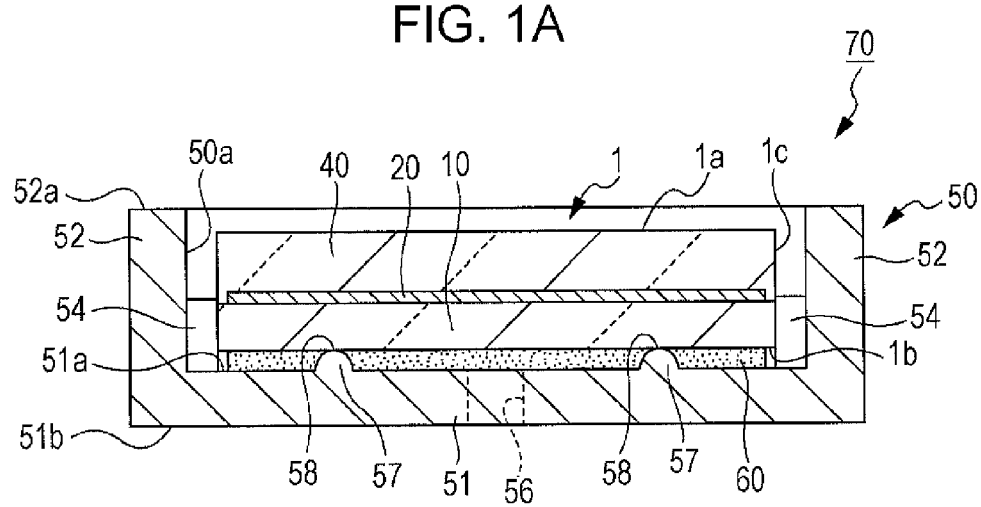
FIGS. 1A and 1B are schematic diagrams showing a schematic configuration of a display device according to an embodiment.
Figure 1B:
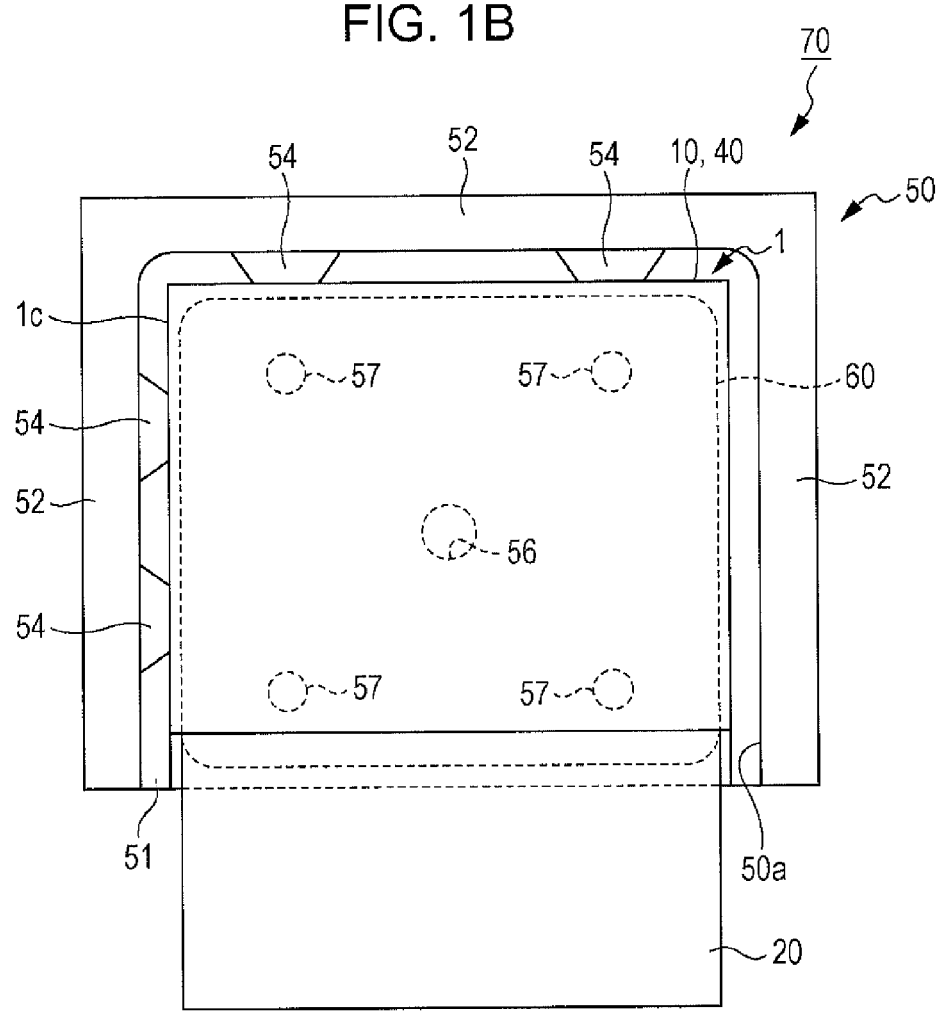

FIGS. 1A and 1B are schematic views showing a schematic configuration of a display device according to a first embodiment; specifically FIG. 1A is a side view of a display device, and FIG. 1B is a plan view of a display device. Then, as shown in FIGS. 1A and 1B, the display device 70 according to the present embodiment includes a display panel 1, a case 50, and an adhesive 60 adhering the display panel 1 and the case 50.

(1) Display Panel

Figure 2:
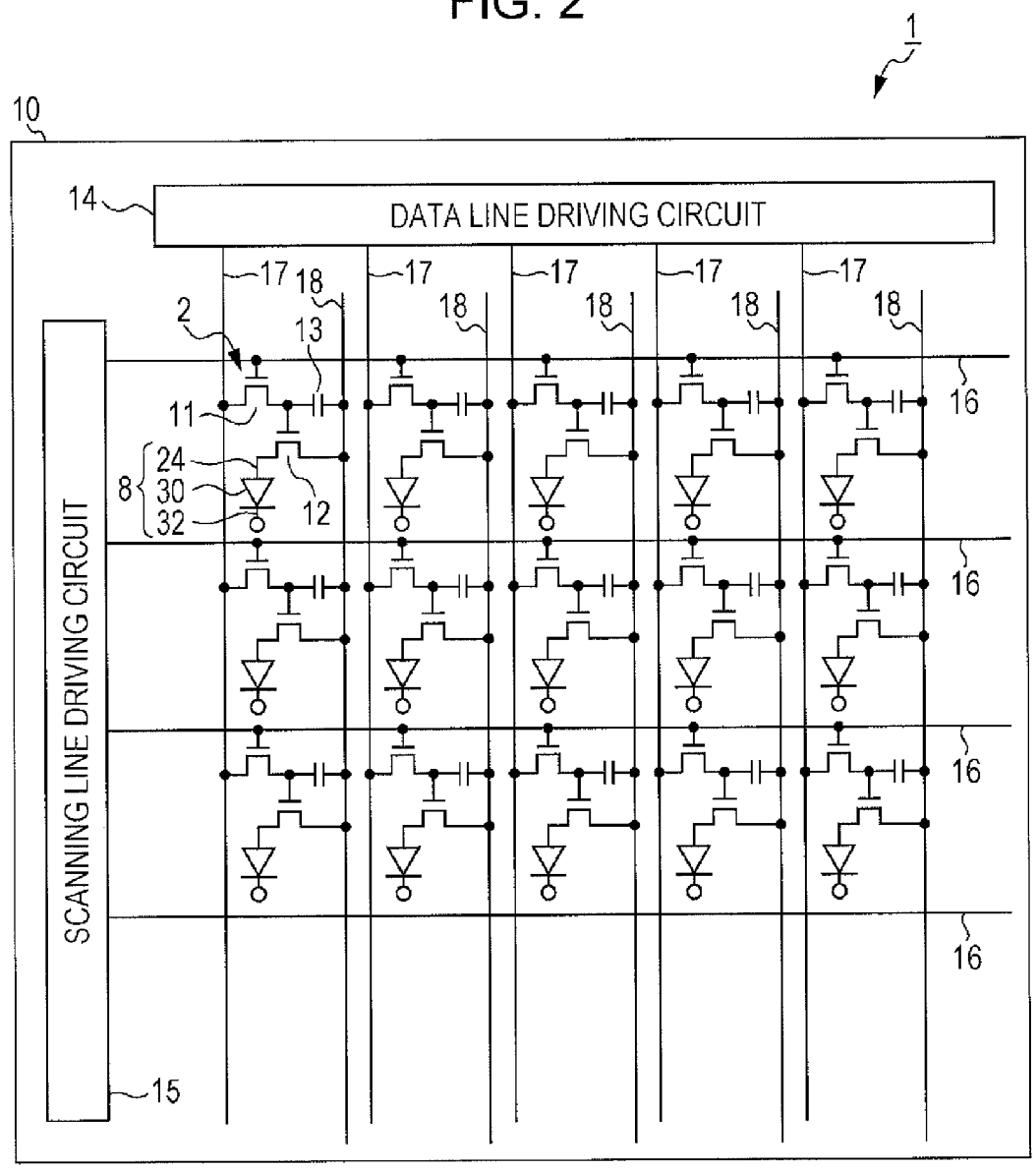
FIG. 2 is an equivalent circuit diagram showing an electrical configuration of a display panel according to an embodiment.
Figure 3:
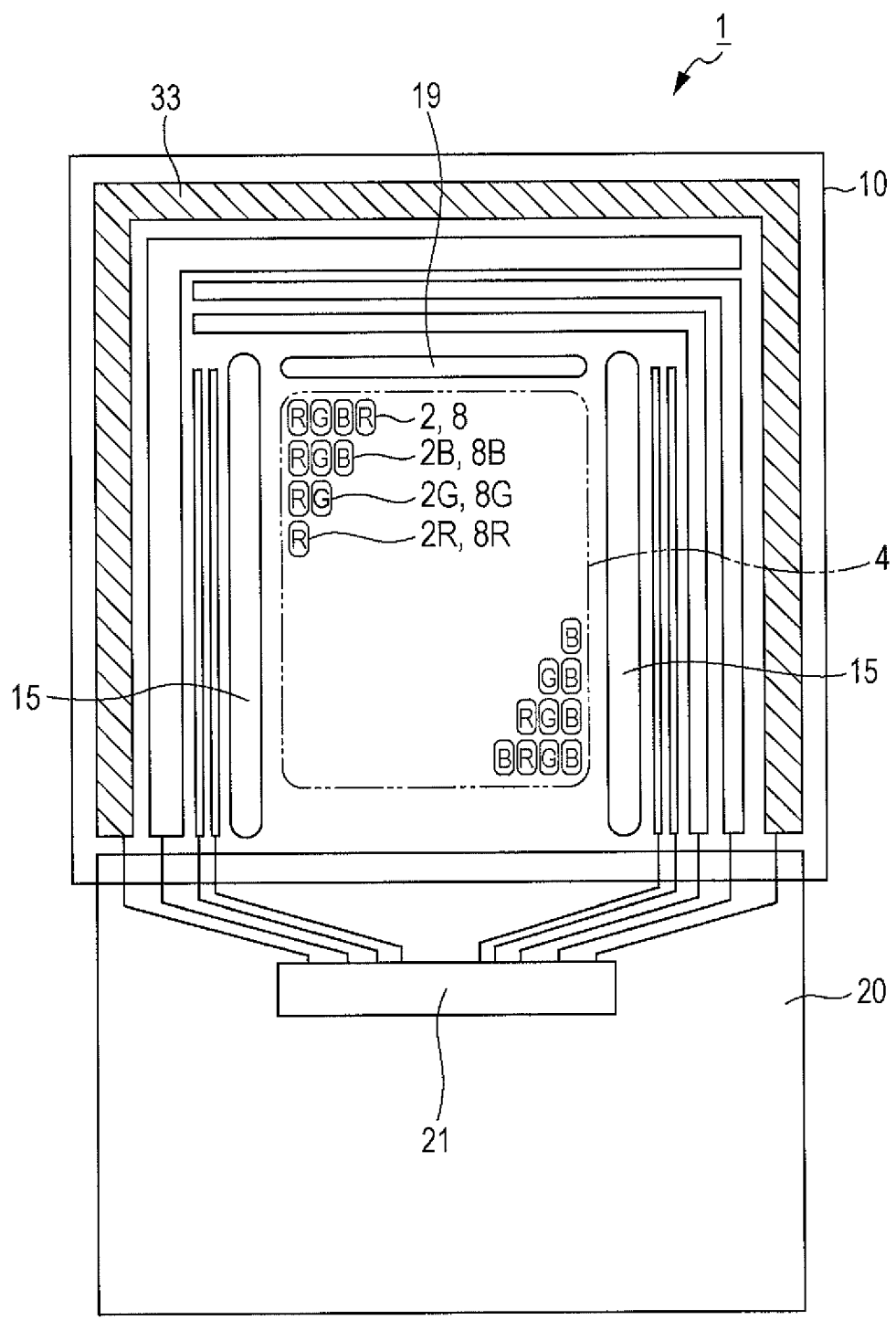
FIG. 3 is a schematic plan view showing a configuration of a display panel according to an embodiment.
Figure 4:
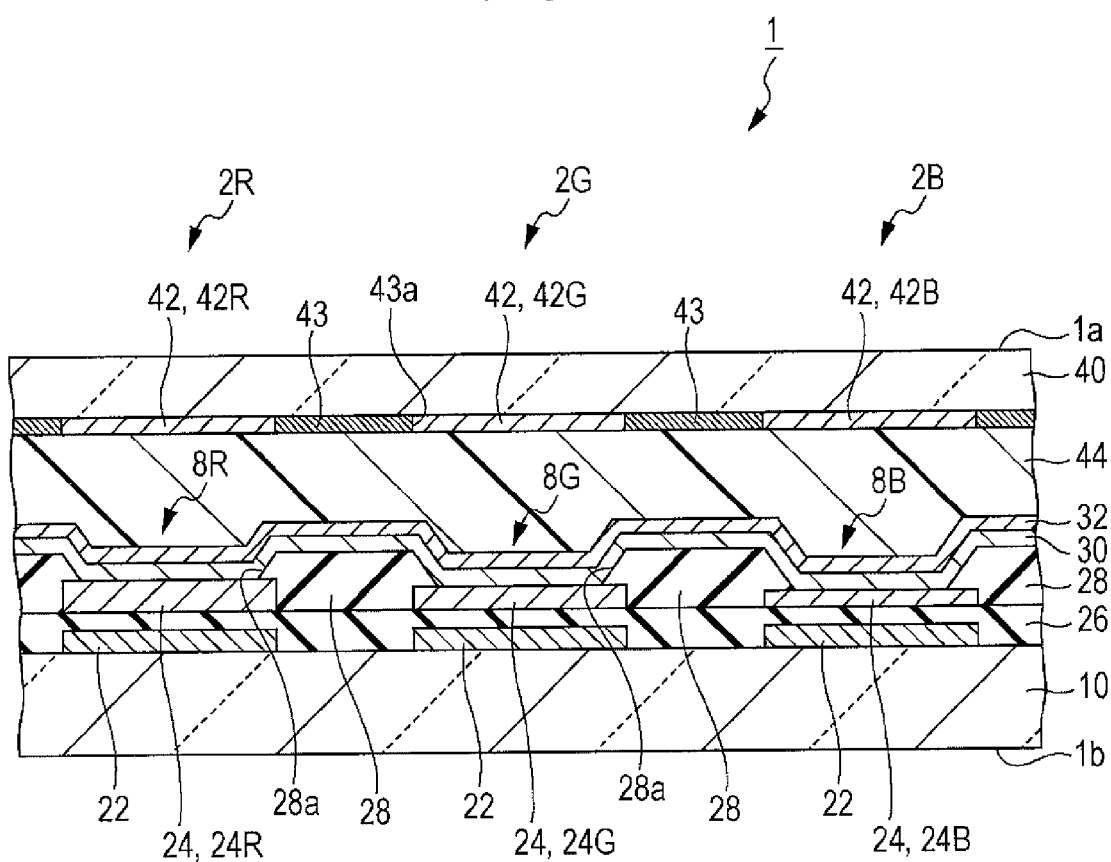
FIG. 4 is a schematic cross-sectional diagram showing a structure of a display panel according to an embodiment.

First, a configuration of the display panel 1 will be described with reference to FIGS. 2, 3 and 4. FIG. 2 is an equivalent circuit diagram showing an electrical configuration of a display panel according to a first embodiment. FIG. 3 is a schematic plan view showing a configuration of a display panel according to a first embodiment. FIG. 4 is a schematic cross-sectional diagram showing a structure of a display panel according to a first embodiment.

As shown in FIG. 2, the display panel 1 is an active matrix-type organic EL panel using transistors as a switching element. The transistor may be a thin film transistor (hereinafter referred to as a "TFT") using in a thin film semiconductor layer, or may be a transistor in which a channel is formed in the semiconductor substrate itself. The display panel 1 includes a substrate 10, scanning lines 16 provided on the substrate 10, signal lines 17 extending in a direction intersecting with respect to the scanning lines 16, and power lines 18 extending in parallel to the signal lines 17.

A data line driving circuit 14 including a shift transistor, a level shifter, a video line, and an analog switch is connected to the signal lines 17. In addition, a scanning line driving circuit 15 including a shift resistor and a level shifter is connected to the scanning lines 16.

The regions of a sub-pixel 2 are partitioned by the scanning lines 16 and signal lines 17. The sub-pixels 2 are the smallest unit of display in the display panel 1, and, for example, are arranged in a matrix formation along the extension direction of the scanning lines 16 and the extension direction of the signal lines 17. A switching transistor 11, a driving transistor 12, a storage capacitor 13, an anode 24, a cathode 32, and an organic functional layer 30 are provided in each sub-pixel 2.

The organic functional layer 30, for example, is configured by positive hole transporting layer, a light emitting layer, and an electron transporting layer laminated in this order. An organic EL element 8 is configured by an anode 24, a cathode 32 and an organic functional layer 30. In the organic EL element 8, light emission is obtained by recombining positive holes injected from the positive hole transporting layer and electrons injected from the electron transporting layer in the light emitting layer.

Then, in the display panel 1, if the switching transistors 11 enter an on state by being driven by the scanning lines 16, an image signal supplied via the signal lines 17 is held in the storage capacitor 13, and the conductive state between the source and drain of the driving transistor 12 is determined according to the state of the storage capacitor 13. Then, when electrically connected to the power line 18 via the driving transistor 12, a driving current flows from the power line 18 to the anode 24, and a current further flows to the cathode 32 through the organic functional layer 30.

The driving current attains a level according to the conductive state between the source and the drain of the driving transistor 12. At this time, the conductive state between the source and the drain of the driving transistor 12, that is, the conductive state of the channel of the driving transistor 12 is controlled by the potential of the gate of the driving transistor 12. Then, the light emitting layer of the organic functional layer 30 emits light with a brightness according to the amount of current flowing between the anode 24 and the cathode 32. In other words, when the light emitting state of the organic EL element 8 is controlled by the driving transistor 12, one of either the source and the drain of the driving transistor 12 is electrically connected to the power line 18, and the other of either the source and the drain of the driving transistor 12 is electrically connected to the organic EL element 8.

In addition, as shown in FIG. 3, the display panel 1, as well as having a substantially rectangular shape in plan view, includes a light emitting region 4 having a substantially rectangular planar shape on the substrate 10. The light emitting region 4 are regions in the display panel 1 substantially contributing to light emission and a dummy region not substantially contributing to light emission may be provided at the periphery of the light emitting region 4. Sub-pixels 2 are arranged in a matrix-shape in the light emitting region 4. The sub-pixels 2 have, for example, a substantially rectangular planar shape. The four angles of the rectangular shape of the sub-pixel 2 may be formed to be rounded. In this case, the planar shape of the sub-pixels 2 may be configured from curved portions corresponding to the four side and four corners.

The display panel 1 according to the present embodiment has sub-pixels 2R emitting light in the red (R) wavelength band, sub-pixels 2G emitting light in the green (G) wavelength band, and sub-pixels 2B emitting light in the blue (B) wavelength band (below, red, green, and blue are respectively denoted by R, G, and B, and are simply referred to as a sub-pixel 2 in cases where the corresponding colors are not distinguished). Organic EL elements 8R, 8G, and 8B are provided corresponding to the sub-pixels 2R, 2G, and 2B (below, referred to simply as organic EL element 8 in cases similar to the sub-pixel 2 where the corresponding colors are not distinguished).

Two scanning line driving circuits 15 and inspection circuit 19 are arranged at the periphery of the light emitting region 4. The inspection circuit 19 is a circuit for inspecting the operation condition of the display panel 1. A cathode wiring 33 is arranged at the outer peripheral portion of the substrate 10. In addition, a flexible substrate 20 is provided on one side of the substrate 10. The flexible substrate 20 is provided with a driving IC 21 connected to each wiring.

In the display panel 1 according to the present embodiment, one unit when forming an image is configured from a pixel group of sub-pixels 2R, 2G, and 2B when forming an image, and it is possible to emit various colors of light by appropriately changing the respective brightnesses of the sub-pixels 2R, 2G, and 2B in the respective units. In so doing, the display panel 1 is capable of full color display or full color light emission.

Furthermore, as shown in FIG. 4, the display panel 1 includes a reflective layer 22, a protective layer 26, an anode 24, an insulating film 28, an organic functional layer 30, a cathode 32, a sealing layer 44, and a counter substrate 40 on the substrate 10. The display panel 1 is a top emission-type in which light emitted from the organic functional layer 30 is emitted to the counter substrate 40 side. In addition, the display panel 1 has an optical resonating structure in which light of each of the R, G, and B wavelength bands is caused to resonate.

Moreover, in the present embodiment, the counter substrate 40 side of the display panel 1 in FIG. 4 is referred to as "upward". Then, the upper surface of the display panel 1 (surface of the counter substrate 40) is referred to as display surface 1a, the lower surface of the opposite side (surface of the substrate 10) is referred to as rear surface 1b, and the surface at which display surface 1a and rear surface 1b intersect in the display panel 1 is referred to as the side face 1c (refer to FIG. 1A). In addition, in the present specification, viewing the counter substrate 40 side surface of the display panel 1 from the normal direction is referred to as "plan view". FIG. 3 is a drawing showing a configuration of a display panel 1 in a state without the counter substrate 40 in plan view.

Since the display panel 1 is a top emission-type, the substrate 10 may use either a translucent material or a non-translucent material in the base material. Examples of the translucent material include, for example, glass, quartz, and resins (plastic, plastic film). Examples of the non-translucent material include, for example, ceramics, such as alumina, metal sheets, such as stainless steel, subjected to an insulating process, such as surface oxidation, and thermosetting resins or thermoplastic resins and films (plastic films) thereof. In addition, although the substrate 10 may be glass, quartz, a resin (plastic, plastic films), ceramic or the like, the substrate 10 may also be a semiconductor substrate, such as silicon, or may be an SOI substrate.

In addition, a reflective layer is 22 is provided on the substrate 10. The reflective layer 22, for example, is formed from a material having light reflecting properties, such as aluminum and silver, or an alloy with aluminum or silver as a main component. Moreover, although not shown in FIG. 4, a driving transistor 12 (refer to FIGS. 1A and 1B) including a semiconductor film, a gate insulating layer, a gate electrode, a drain electrode and a source electrode is provided for each sub-pixel 2 (2R, 2G, 2B) on the substrate 10. The substrate 10 may be covered with an insulating layer formed from silicon dioxide ($SiO_2$), a planarizing layer or the like.

The protective layer 26 is provided so as to cover the substrate 10 and the reflective layer 22. The upper surface of the protective layer 26 is flattened. The protective layer 26, for example, is formed from an inorganic insulating film, such as silicon dioxide ($SiO_2$), silicon nitride (SiN), or silicon oxynitride (SiON). The protective layer 26 may also be formed from an organic resin, such as an acrylic resin or a polyimide resin.

Anodes 24 (24R, 24G, 24B) is provided on the protective layer 26. Anodes 24R, 24G, and 24B are arranged corresponding to the sub-pixels 2R, 2G, and 2B. The layer thickness of the anodes 24R, 24G, and 24B are different from one another because of adjusting the optical distance (optical path length) of the optical resonance structure, and become thicker in the order of anode 24B, anode 24G and anode 24R. The anode 24 is formed from a conductive material having transparency and, for example, is configured from ITO (indium tin oxide) or $ZnO_2$.

The insulating film 28 is provided on the protective layer 26. The insulating film 28 has an opening portion 28a partitioning the regions of the sub-pixel 2. The opening portion 28a is formed slightly smaller than the anode 24. The insulating film 28 is formed so as to run over the peripheral edge portion of the anode 24 for a predetermined width along the periphery of the opening portion 28a. The insulating film 28 is formed from an inorganic insulating material, such as silicon dioxide ($SiO_2$), or an acrylic resin.

The organic functional layer 30 is provided so as to cover the anode 24 (24B, 24G, 24R) and the insulating film 28.

The organic functional layer 30, for example, is configured from a positive hole transporting layer, a light emitting layer, and an electron transporting layer. The layers configuring the organic functional layer 30 may be formed using known materials. In the organic functional layer 30, emission of white light is obtained by recombining positive holes injected from the positive hole transporting layer and electrons injected from the electron transporting layer in the light emitting layer. Moreover, heat generation accompanies light emission by the organic functional layer 30.

The cathode 32 is provided so as to cover the organic functional layer 30. The cathode 32 functions as a semi-transparent reflective layer having the characteristic (that is, semi-transparent reflective) of reflecting one portion of the light reaching the surface thereof while allowing another portion to pass through. The cathode 32 is formed from magnesium (Mg) or silver (Ag) or an alloy or the like with these as a main component.

The organic EL elements 8 (8R, 8G, 8B) are configured by the anodes 24 (24R, 24G, 24B), the organic functional layer 30 and the cathode 32. The organic EL elements 8R, 8G, and 8B are arranged corresponding to the sub-pixels 2R, 2G, and 2B.

Moreover, although not shown in the drawings, a passivation layer is provided on the cathode 32. The passivation layer is a protective film for preventing the deterioration of the organic EL element 8 due to infiltration of oxygen or moisture. The passivation layer is, for example, formed from an inorganic material with a low gas permeability, such as $SiO_2$, SiN, or SiON.

On the substrate 10 on which a plurality of organic EL elements 8 (8R, 8G, 8B) are formed, a counter substrate 40 is arranged facing the substrate 10. The counter substrate 40 is configured by a translucent material such as glass. At least a color filter 42 (42R, 42G, 42B) is formed on the surface of the substrate 10 side of the counter substrate 40, and may have a light blocking layer 43.

The display panel 1 has a color filter 42R corresponding to the R wavelength band, a color filter 42G corresponding to the G wavelength band, and a color filter 42B corresponding to the B wavelength band as the color filter 42. The color filters 42R, 42G, and 42B are arranged corresponding to the sub-pixels 2R, 2G, and 2B, and are provided so as to overlap the organic EL elements 8R, 8G and 8B in plan view. The color filters 42R, 42G, and 42B selectively allows light in each of the R, G, and B wavelength bands to pass through from the light emitted from the organic EL elements 8R, 8G, and 8B.

The light blocking layer 43 has an opening portion 43a corresponding to the organic EL elements 8R, 8G, and 8B, and partitions the color filters 42R, 42G, and 42B with the opening portion 43a. The counter substrate 40 on which the color filters 42R, 42G, and 42B and the light blocking layer 43 are formed is bonded to the substrate 10 via a sealing layer 44. The sealing layer 44 is formed from a curable resin, such as a translucent resin material, for example, an epoxy resin.

(2) Case and Adhesive

Figure 6A:
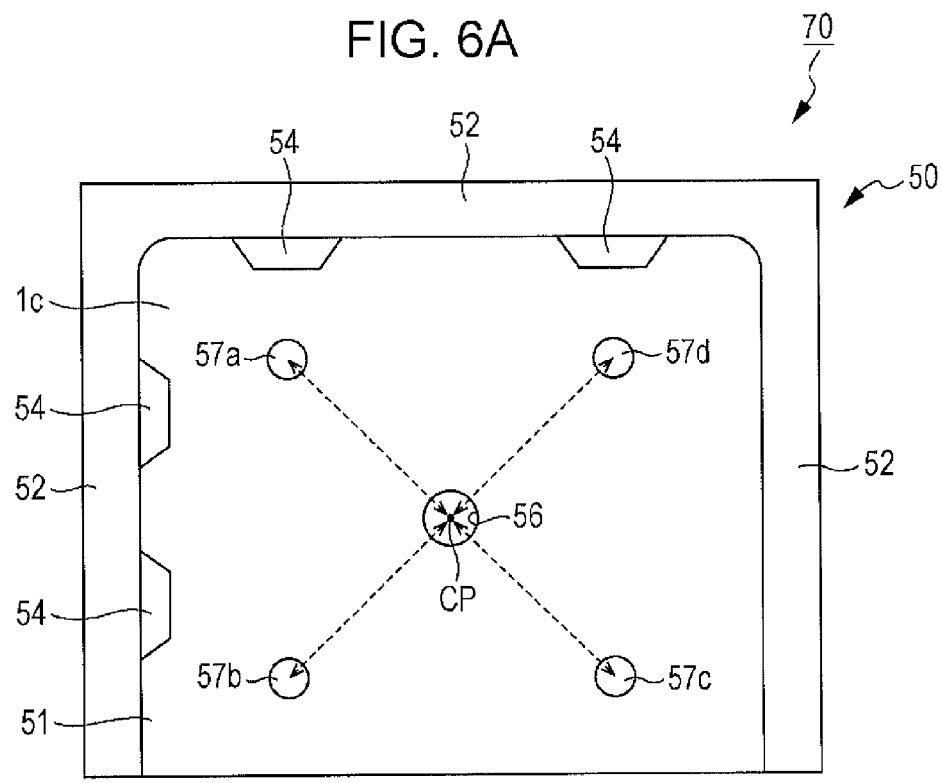
FIGS. 6A and 6B are top views showing the positional relationship of protrusions of a display device according to an embodiment.
Figure 6B:
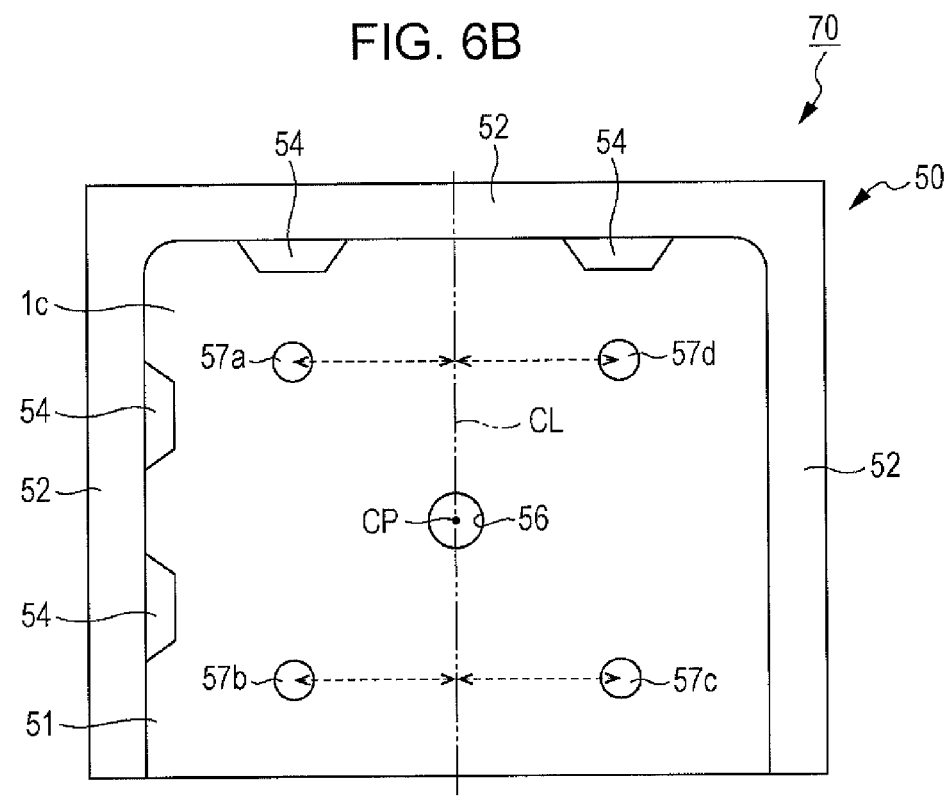

Next, the case 50 and the adhesive 60 will be described with reference to FIGS. 1A and 1B, FIG. 5 and FIGS. 6A and 6B. FIG. 5 is an exploded perspective view of a display device according to the present embodiment, and FIGS. 6A and 6B are top views showing the positional relationship of protrusions 57 according to the present embodiment.

As shown in FIG. 1B, the case 50 has a substantially rectangular shape in plan view. The case 50 has a function of reinforcing and protecting the display panel 1 from external forces and the like, as well as having a function dissipating heat occurring when the organic EL element 8 emits light to the outside of the display panel 1. The case 50, for example, is formed from a metallic material such as aluminum or copper, or an alloy thereof.

As shown in FIG. 5, the case 50 has a bottom portion 51, a side portion 52 placed upright on a side opposing the display panel 1 of the bottom portion 51, a groove portion 50a is formed by the bottom portion 51 and the side portion 52, and the display panel 1 is fitted into the groove portion 50a. The bottom portion 51 of the groove portion 50a has a substantially rectangular shape in plan view. The surface of the side opposing the display panel 1 of the bottom portion 51 (rear surface 1b) is referred to as the bottom surface 51a of the case, and the surface of the opposite side thereto is referred to as the outer surface 51b.

Moisture permeable holes 56 penetrating the bottom portion 51 are provided in the bottom portion 51. The moisture permeable holes 56, for example, are provided at the center of sites in the bottom portion 51 at which the display panel 1 is adhered (below, referred to as adhesion sites), that is, at the center of the bottom surface 51a of the case. In the present embodiment, the center is the center part in the range over which the adhesive 60 is arranged. Moreover, in FIG. 5, the range over which the adhesive 60 is first coated is shown with a broken line. Although the moisture permeable holes 56, for example, are round, straight holes in plan view, the holes may also have a shape such as an ellipse or a polygon, and may be holes with a tapered shape in which the diameter widens towards the case outer surface 51b.

Furthermore, the moisture permeable holes 56 may be configured to also serve as a fixing screw hole or a positioning pin hole, or the like, when the display device 70 is incorporated with the electronic apparatus, and in such a case, the moisture permeable holes 56 are provided with a shape, size and arrangement position suitable to the each of these roles and the configuration of the electronic apparatus or the like.

Then, four protrusions 57 are formed on the bottom surface 51a of the case at the periphery of the moisture permeable hole 56. These protrusions 57 contact the rear surface 1b of the display panel 1, and are members for securing a predetermined distance between the bottom surface 51a of the case and the rear surface 1b of the display panel 1. In the present embodiment, the protrusions 57 are integrally molded with the case 50 and are formed from a metallic material such as aluminum or copper, or an alloy thereof. The protrusions 57, as shown in FIG. 1B, have a hemispherical shape so as to become thinner toward the apex 58 contacting the rear surface 1b of the organic EL panel, the heights thereof may be the same for each protrusion 57, and may be formed with a thickness of an extent enabling the adhered members to be appropriately adhered to one another by the adhesive 60, approximately 0.5 mm.

The plurality of protrusions 57 are arranged to be point symmetric with respect to the center point CP of the bottom surface 51a of the case or linearly symmetric with respect to a center line CL passing through the center point CP, so as to be arranged at equal distances from the center of the moisture permeable hole 56. Specifically, as an example of being arranged to be point symmetric, as shown in FIG. 6A, the protrusion 57a and the protrusion 57c are arranged to be point symmetric with the center point CP as a center. In addition, the protrusion 57b and the protrusion 57d are arranged so as to be point symmetric with the center point CP as a center.

Meanwhile, as an example of being arranged to be linearly symmetric, as shown in FIG. 6B, the protrusion 57a and the protrusion 57d are arranged to be linearly symmetric with the center line CL passing through the center point CP as an axis. In addition, the protrusion 57b and the protrusion 57c are arranged to be linearly symmetric with the center line CL as an axis. Moreover, in the present embodiment, although four protrusions 57 are formed on the bottom surface 51a of the case, at least three protrusions 57 may be formed if contacting the rear surface 1b of the organic EL panel and the parallelism between the display panel 1 and the case is secured. In addition, in the present embodiment, although the protrusions 57, for example, are formed from a metallic material such as aluminum, the protrusions may be attachable and detachable from the case and formed from a curable material, such as resin.

Side portions 52 are provided on 3 lateral sides of the bottom portion 51 with a substantially rectangular shape in plan view. When adhering the display panel 1 and the case 50, the one lateral side of the case 50 on which the side portion 52 is not provided is arranged so as to correspond to the side on which the flexible substrate 20 of the display panel 1 is provided. Accordingly, the side portion 52 is arranged so as to surround side face 1c on 3 sides excepting the side on which the flexible substrate 20 of the display panel 1 is provided.

The face above the side portion 52 is referred to as the upper surface 52a. Projections 54 holding the side face 1c of the display panel 1 are provided on the inner side (side opposing the side face 1c of the display panel 1) of the side portion 52 on at least two of the three sides other than the side on which the flexible substrate 20 is provided. Moreover, the case 50 may have protrusions or fins for dissipating heat other than the projections 54. In addition, it is possible to not include the projections 54 if the position of the display panel 1 is able to be fixed by the inner side of the side portion 52. Furthermore, the shape of the case 50 may be a shape (shape suited to the shape of the electronic apparatus side) suitable to incorporation in a case in which the display device 70 is incorporated in an electronic apparatus such as a smartphone described later.

As shown in FIG. 1A, the display panel 1 and the case 50 are adhered to one another due to the adhesive 60 arranged between the substrate 10 (rear surface 1b) of the display panel 1 and the bottom portion 51 (bottom surface 51a of the case) of the case 50. Moreover, in order to protect the display panel 1, it is preferable that the upper surface 52a of the side portion 52 be upwards of the display surface 1a of the display panel 1.

In the display device 70, the heat generated by the organic EL element 8 of the display panel 1 is propagated from the substrate 10 to the bottom portion 51 of the case 50 via the adhesive 60. In addition, the heat generated by the organic EL element 8 is also propagated from the substrate 10 to the projections 54 of the case 50. In so doing, the heat generated by the organic EL element 8 is propagated from the case 50 to outside the display device 70.

The adhesive 60 is formed from a moisture-curable silicon adhesive that cures by reacting to moisture (water content) in the atmosphere or moisture (water content) included in an adherend. As the moisture-curable silicon adhesive, a two-liquid type epoxy adhesive may be used in which a liquid resin known as an epoxy resin is mixed with a curing agent known as a polyamine, and that cures by being chemically reacted (cross-linking) in the room temperature region. In addition, as the viscosity of the adhesive, an adhesive with a high viscosity of approximately 1000 mPa may be suitably used. In the present embodiment, the adherends are the substrate 10 of the display panel 1 and the case 50, and these adherends include almost no water content. Accordingly, the adhesive 60 is cured through reacting with moisture in the atmosphere.

Moreover, in a case in which a thermosetting adhesive or an ultraviolet curable adhesive is used as the adhesive, there is concern of the characteristics of the organic material of the organic functional layer 30 being degraded by heat or ultraviolet rays when the adhesive is cured. In addition, in a case in which a moisture-curable instant adhesive is used, there is concern of adhesive peeling from the adherend due to contraction when the adhesive is cured or adhesive peeling from the adherend due to water content attaching after curing occurring. Accordingly, it is desirable that a moisture-curable silicon adhesive be used.

As shown in FIG. 1B, the planar shape (shape of the outer periphery) of the cured adhesive 60 is, for example, a frame shape. When the substrate 10 and the case 50 are adhered, for example, the adhesive 60 is coated between the substrate 10 and the case 50 using a dispenser or the like. Then, the adhesive 60 is cured by being reacted with moisture in the atmosphere in a state in which pressure is applied between the display panel 1 and the case 50. Accordingly, the planar shape of the adhesive 60 is formed by the process in which the adhesive 60 is coated and cured, and may be another shape including a substantially circular shape or a substantially elliptical shape, rather than being limited to a frame shape.

(3) Electronic Apparatus

Figure 7:
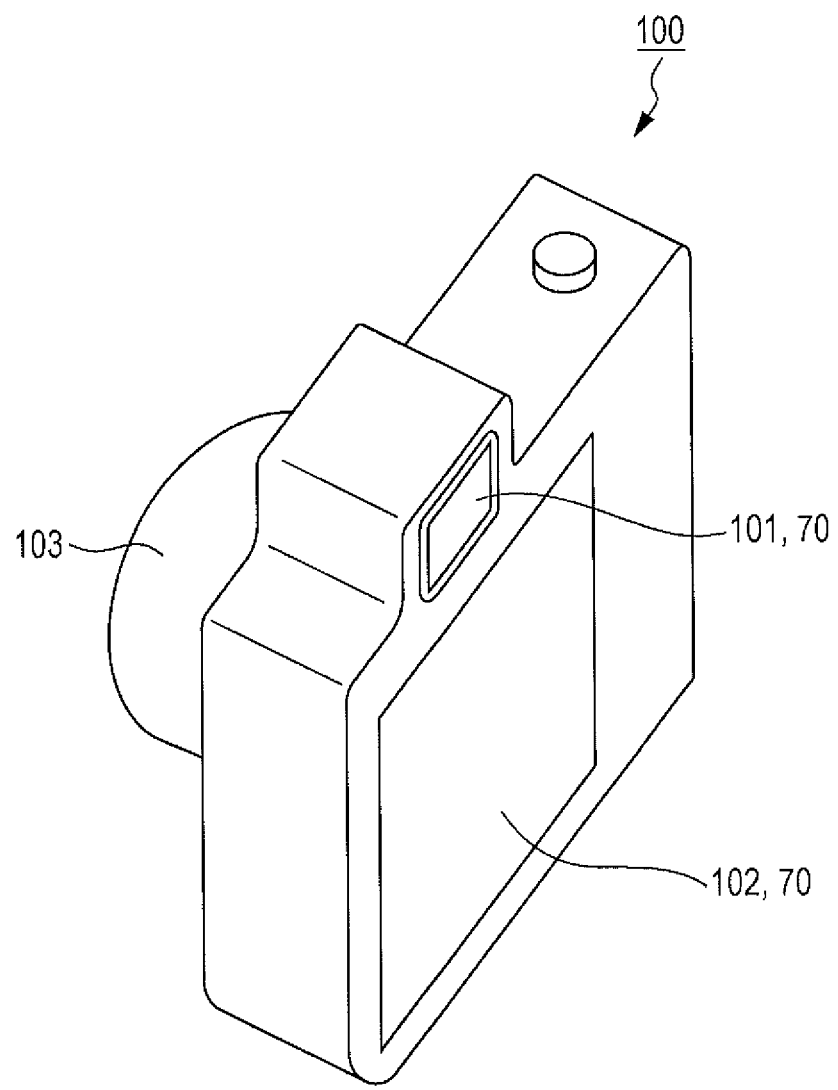
FIG. 7 is a schematic diagram showing an electrical viewfinder as one example of an electronic apparatus including a display device according to an embodiment.

Next, an electronic apparatus according to the present embodiment will be described. FIG. 7 is a schematic diagram showing an electrical viewfinder as one example of an electronic apparatus including a display device according to the present embodiment. As shown in FIG. 7, the above-described display device 70 is included in an electrical viewfinder 101 and rear surface display 102 in a digital camera 100 as an electronic apparatus.

In such a digital camera 100, light entering from the lens 103 is converted to image data by being captured with an imaging element, such as a Charge Coupled Device image sensor (CCD image sensor), and the image data is displayed on the screen of the electrical viewfinder 101 and the rear surface 102.

The above-described display device 70 may be used in various electronic apparatuses, such as a mobile telephone device, a head mounted display (HMD), small-sized projector, a mobile computer, a digital video camera, a display, a vehicle-mounted device, an audio device, an exposure apparatus or an illumination device, In addition to the digital camera 100 (electrical viewfinder 101).

Action and Effects

As described above, according to the configuration of the display device 70 and electronic apparatus according to the present embodiment, since a plurality of protrusions 57 are provided on the bottom surface 51a of the case adhered to the rear surface 1b of the display panel 1, when pressure is applied by fitting the display panel 1 to the case 50, the protrusion 57 bumps against the rear surface 1b of the display panel 1 and it is possible to secure the parallelism of the display panel 1 and the case 50 with high precision because the distance between the rear surface 1b of the display panel 1 and the bottom surface 51a of the case becomes fixed.

Figure 8A:
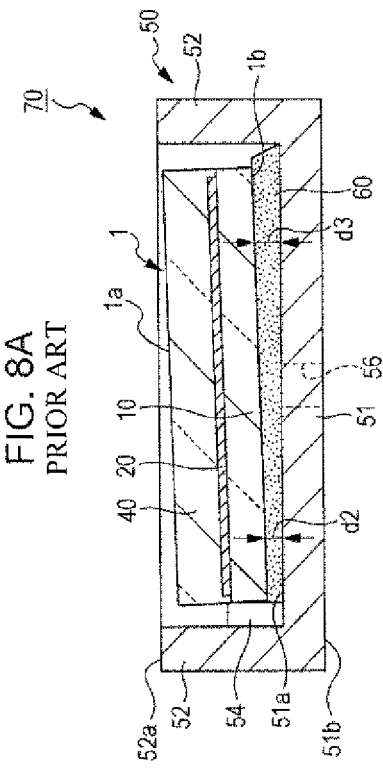
FIG. 8A is a schematic cross-sectional diagram showing the positional relationship between an organic EL panel and a case according to the related art.
Figure 8B:
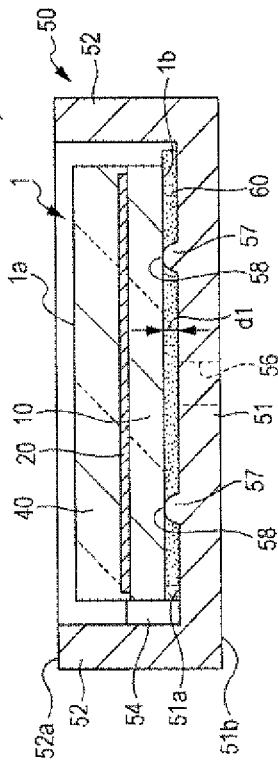
FIG. 8B is a schematic cross-sectional diagram showing the positional relationship of an organic EL panel and a case according to the present embodiment.

That is, as shown in FIG. 8A, when the display panel 1 and the case 50 are bonded with a configuration as in the related art, when weighting, variations occur in the method of adding pressure with respect to each position on the surface and differences occur in the method of spreading the adhesive because there are no protrusions 57. Therefore, in each position in the surface, differences in the thickness of the adhesive occur, and there is a problem in which a part with a short distance d2 and a part with a long distance d3 are formed between the rear surface 1b of the display panel 1 and the bottom surface 51a of the case, and the parallelism between the adherends is lowered. In contrast, according to the embodiment, since there are protrusions 57, when pressure is added by fitting the display panel 1 to the case 50 as shown in FIG. 83, the protrusions 57 bump into the rear surface 1b of the display panel, and the distance between the rear surface of the display panel and the bottom surface of the case becomes fixed.

Next, an adhesive 60 is accommodated in the space in which the distance between the rear surface 1b of the display panel 1 and the bottom surface 51a of the case is fixed, and the display panel 1 and the case 50 are adhered by the adhesive 60. In this way, in the present embodiment, when the display panel 1 and the case 50 are adhered by the adhesive 60, it is possible to adhere the adhered members to each other by securing the parallelism between the display panel 1 and the case 50 with high precision, rather than adjusting the amount of weighting applied to the substrate or the weighting time.

In addition, according to the present embodiment, since the height of the protrusions 57 is set to 0.5 mm, the thickness of the adhesive 60 adhering the display panel 1 and the case 50 also becomes 0.5 mm, and it is possible to set the adhesive 60 to an appropriate adhesion strength. At this time, two or more protrusions 57 are provided, and since a plurality of protrusions 57 are arranged to be point symmetric with respect to the center point CP of the bottom surface of the groove portion or to be linearly symmetric with respect to the center line CL passing through the center point CP, each protrusion 57 arranged interposing the center point CP or the center line CL appropriately bumps into the rear surface 1b of the display panel, and it is possible to fix the distance between the rear surface 1b of the display panel 1 and the bottom surface 51a of the case on the surface. As a result, it is possible to precisely secure the parallelism between each adherend.

Furthermore, according to the present embodiment, moisture permeable holes 56 are included in the center of the bottom surface of the groove portion, and since the protrusions 57 are arranged at the periphery of the moisture permeable holes, parts of the adhesive 60 arranged between the case 50 and the substrate 10 overlapping the moisture permeable holes are exposed. Therefore, since the moisture-curable adhesive 60 contacts the air not only at the tip, but also at parts overlapping the moisture permeable holes 56, curing progresses more easily compared to a case in which the moisture permeable holes 56 are not provided.

In addition, because the protrusions 57 have a shape which is hemispherical and becomes thinner towards the apex, the apex 58 contacting the display panel 1 is in point contact with respect to the rear surface 1b. Therefore, when the display panel 1 is pressed, the adhesive 60 coated on the upper portion of the apex 58 becomes expanded to the periphery, and when the adhered members are bonded, adhesive is not present on the apex 58 of the protrusions 57. In so doing, it is possible for the protrusions 57 to reliably bump into the rear surface 1b of the organic EL panel, and possible to secure parallelism between each adherend with high precision.

Furthermore, in the present embodiment, since the electronic apparatus includes such display device in which the parallelism is highly precise, it is possible to provide a high quality and high capacity electronic apparatus. That is, in a case where an electrical viewfinder is used as an electrical device, because image light emitted from the display panel 1 of the electrical viewfinder is guided to be perpendicular with respect to the eye of a user, the subject may be viewed in the same position as a case in which the subject is directly observed. Therefore, even in a case in which the subject is observed through the electrical viewfinder with one eye and the subject is directly observed with the other eye, it is possible to prevent the occurrence of shifting in the subject.

MODIFICATION EXAMPLES

Moreover, the above-described embodiment thoroughly shows one form of the invention, and arbitrary modifications and applications are possible within the scope of the invention. As a modification example, for example, the following may be considered. Moreover, constituent elements in common with the above-described embodiment are given the same reference numerals, and description thereof will not be made.

(1) Modification Example 1

In the display device of the above-described embodiment, although the shape of the protrusions 57 is hemispherical, the invention is not limited to such a form and as long as the shape becomes thinner towards the apex 58, for example, the shape may be a pyramid or cone in which the apex 58 has a pointed shape. Even in such a case, when the display panel 1 and the case 50 are bonded, the adhesive 60 is extruded from the apex 58 of the protrusions 57, and the adhesive 60 is not present between the apex 58 and the rear surface 1b of the display panel 1. Moreover, in the modification example 1, the configuration is set so that at least three protrusions are arranged on the bottom surface 51a of the case.

(2) Modification Example 2

In addition, in the above-described embodiment, although the protrusions 57 have a configuration formed with a hemispherical shape and support the rear surface 1b of the display panel 1 at points, the invention is not limited thereto and, for example, a member may be used in which the apex 58 contacting the rear surface 1b of the display panel 1 becomes linear, such as a triangular pillar or an arc shape. Then, in a protrusion with such a shape, a configuration is set in which at least two protrusions 57 are arranged on the bottom surface 51a of the case.

In this case, because the locations supporting the rear surface 1b of the display panel 1 increase, the parallelism between the display panel 1 and the case 50 is held even if the number of protrusions is reduced. Moreover, even in this case, the apex 58 preferably has a curved shape or a pointed shape. In addition, the arc-shaped protrusions are preferably arranged to be point symmetric with respect to the center point CP of the bottom surface of the groove portion or linearly symmetric with respect to the center line CL passing through the center point CP.

(3) Modification Example 3

Furthermore, in the above-described embodiment and each modification example, although a plurality of the protrusions 57 are arranged with the same shape, it is possible to use a combination of protrusions with shapes according to the above-described embodiment and modification examples.

For example, the protrusions 57 with a pyramid shape according to modification example 1 and the protrusions 57 with an arc shape according to modification example 2 may be selected and used. In this case, the center parts of the protrusions 57 with a pyramid shape and the protrusions 57 with the arc shape according to the modification example are arranged to be point symmetric with the center point CP as a center or to be linearly symmetric with the center line CL as an axis. Moreover, in such a modification example, the configuration is set so that at least two protrusions are arranged on the bottom surface 51a of the case.

(4) Modification Example 4

In the above-described embodiment, although only the protrusions 57 are formed on the bottom surface 51a of the case, as long as the protrusions 57 are arranged, a groove by which the flow of the adhesive 60 is promoted may be formed in the bottom surface 51a of the case. In this case, different from a case in which only the groove is formed, it is possible for the flow of the adhesive 60 to be promoted by the groove along with securing the parallelism between the display panel 1 and the case 50 by the protrusions 57.

(5) Modification Example 5

In the display panel 1 of the above-described embodiment, although the configuration optimizes the optical distance of an optical resonator by causing the layer thickness of the anode 24 to be different with respect to the sub-pixels 2R, 2G and 23, the invention is not limited to such a form. With respect to the sub-pixels 2R, 2G, 2E, a configuration may be used optimizing the optical distance of an optical resonator by making the layer thickness of the insulating layer or the like arranged between the reflective layer 22 and the cathode 32 different, or laminating a plurality of insulating layers or conductive layers, or making the layer thickness of the organic functional layer 30 different.

(6) Modification Example 6

Although the display panel 1 of the above-described embodiment has a configuration having an optical resonating structure, the invention is not limited to such a form. The display panel 1 may have a configuration not having an optical resonating structure. In addition, although the display panel 1 has a configuration in which the organic functional layer 30 emits white light, a configuration may be used in which the organic functional layer 30 is formed by separately coating materials emitting each of the R, G and B colors of light.

The entire disclosure of Japanese Patent Application No. 2013-002367, filed Jan. 10, 2013 is expressly incorporated by reference herein.

What is claimed is:
1. A display device comprising:
a display panel in which a display surface is formed on a substrate;
a case having a groove portion with which the display panel is fitted;
an adhesive adhering a bottom surface of the groove portion and a rear surface of the substrate; and a protrusion formed on the bottom surface of the groove portion and having a predetermined height, the protrusion extending between the rear surface of the substrate and the bottom surface of the groove portion, and the adhesive contacting the protrusion and the rear surface of the substrate, wherein the adhesive surrounds the protrusion in an area between the bottom surface of the groove portion and the rear surface of the substrate.

2. The display device according to claim 1, wherein two or more of the protrusions are provided.

3. The display device according to claim 2, wherein the protrusions are arranged to be point symmetric with respect to a center point of the bottom surface of the groove portion or linearly symmetric with respect to a center line passing through the center point.

4. The display device according to claim 2, further comprising:

a hole penetrating the bottom surface in a center of the bottom surface of the groove portion, wherein the two or more protrusions are arranged at the periphery of the hole.

5. The display device according to claim 1, wherein the protrusion are formed to become thinner toward an apex.

6. A display device comprising:

a display panel in which a display surface is formed on a substrate;

a case having a groove portion with which the display panel is fitted;

an adhesive adhering a bottom surface of the groove portion and a rear surface of the substrate; and protrusions formed on the bottom surface of the groove portion and having a predetermined height, the protrusions extending between the rear surface of the substrate and the bottom surface of the groove portion, and the adhesive contacting the protrusions and the rear surface of the substrate, wherein the adhesive surrounds the protrusions in an area between the bottom surface of the groove portion and the rear surface of the substrate.

7. The display device according to claim 6, wherein the protrusions are arranged to be point symmetric with respect to a center point of the bottom surface of the groove portion or linearly symmetric with respect to a center line passing through the center point.

8. The display device according to claim 6, further comprising:

a hole penetrating the bottom surface in a center of the bottom surface of the groove portion, wherein the protrusions are arranged at the periphery of the hole.

9. The display device according to claim 5, wherein the protrusions are formed to become thinner toward an apex.

10. An electronic apparatus comprising the display device according to claim 1.

11. An electronic apparatus comprising the display device according to claim 2.

12. An electronic apparatus comprising the display device according to claim 3.

13. An electronic apparatus comprising the display device according to claim 4.

14. An electronic apparatus comprising the display device according to claim 5.

15. An electronic apparatus comprising the display device according to claim 6.

16. An electronic apparatus comprising the display device according to claim 7.

17. An electronic apparatus comprising the display device according to claim 8.

18. An electronic apparatus comprising the display device according to claim 9.

* * * * *